United States Patent
Obara et al.

(10) Patent No.: US 6,562,705 B1
(45) Date of Patent: May 13, 2003

(54) METHOD AND APPARATUS FOR MANUFACTURING SEMICONDUCTOR ELEMENT

(75) Inventors: Takashi Obara, Yokohama (JP); Hideki Nozaki, Kawasaki (JP); Motoshige Kobayashi, Kawasaki (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/696,167

(22) Filed: Oct. 26, 2000

(30) Foreign Application Priority Data

Oct. 26, 1999 (JP) ............................................ 11-303614

(51) Int. Cl.⁷ .............................................. H01L 21/26
(52) U.S. Cl. ....................... 438/535; 438/567; 438/568; 438/795; 438/798; 118/715
(58) Field of Search ................................. 438/535, 567, 438/568, 795, 798; 118/715

(56) References Cited

U.S. PATENT DOCUMENTS

| | | | |
|---|---|---|---|
| 4,281,030 A | * 7/1981 | Silfvast | 219/121.15 |
| 4,664,940 A | * 5/1987 | Bensoussan et al. | 204/192.1 |
| 4,941,430 A | * 7/1990 | Watanabe et al. | 118/723 FE |
| 5,565,377 A | * 10/1996 | Weiner et al. | 117/53 |
| 5,569,624 A | * 10/1996 | Weiner | 438/285 |
| 5,841,197 A | * 11/1998 | Adamic, Jr. | 257/500 |
| 5,925,421 A | * 7/1999 | Yamazaki et al. | 427/534 |

FOREIGN PATENT DOCUMENTS

| | | | |
|---|---|---|---|
| JP | 63-40318 | * | 2/1988 |
| JP | 3-283626 | | 12/1991 |
| JP | 05-21605 | * | 1/1993 |
| JP | 5-326430 | | 12/1993 |

OTHER PUBLICATIONS

Weiner et al.,"Low–Temperature Fabrication of p+–n Diodes with 300 Å Junction Depth" IEEE, IEDM, v. 13, No. 7, Jul. 1992, pp. 369–371.*

* cited by examiner

Primary Examiner—Amir Zarabian
Assistant Examiner—Jeff Vockrodt
(74) Attorney, Agent, or Firm—Oblon, Spivak, McClelland, Maier & Neustadt, P.C.

(57) ABSTRACT

A laser heating apparatus for forming an electrode on one surface of an Si chip provided on an Si wafer, thereby producing a semiconductor element, comprises a high vacuum chamber having a light transmission window, an XY table contained in the high vacuum chamber for mounting the Si wafer thereon, heater contained in the high vacuum chamber for heating and evaporating an impurity in a solid state, and laser beam applying means for applying a laser beam to the Si chip placed on the XY table from the outside of the high vacuum chamber through the light transmission window, thereby implanting the impurity into the Si in chip and activating the implanted impurity.

13 Claims, 4 Drawing Sheets

METHOD AND APPARATUS FOR MANUFACTURING SEMICONDUCTOR ELEMENT

CROSS-REFERENCE TO RELATED APPLICATIONS

This application is based upon and claims the benefit of priority from the prior Japanese Patent Application No. 11-303614, filed Oct. 26, 1999, the entire contents of which are incorporated herein by reference.

BACKGROUND OF THE INVENTION

This invention relates to a method and apparatus for manufacturing a semiconductor element, and more particularly to a technique for simultaneously executing doping and activation of an impurity when depositing an aluminum alloy film on the reverse surface of a semiconductor element to thereby form a collector electrode.

A semiconductor element such as an IGBT (Insulated Gate Bipolar Transistor), a PMOS device, etc. has a structure in which a source/drain electrode is provided on one surface of a semiconductor substrate, and a collector electrode is provided on the other surface (reverse surface) of the substrate.

In the case of an IGBT, for example, it is necessary, when forming a collector electrode, to form a P-type layer, doped with B (boron) having its concentration controlled, in an N-type Si substrate adjacent to the collector electrode. The P-type layer is formed by doping the substrate with boron by ion implantation or chemical doping, then shifting the substrate to a diffusion furnace, and activating the doped boron.

Japanese Patent Application KOKAI Publication No. 5-326430, for example, discloses a chemical doping in which a wafer is placed in a chamber, then a reactive gas containing an impurity and an additive is supplied from the outside to the chamber having its interior kept in a vacuum state, and a laser beam is applied to the wafer in the vacuum atmosphere to dope the impurity.

Further, there is a case where a cheap raw wafer is used instead of an epitaxial grown wafer, an OSL, etc. In the case of using the raw wafer, it has a thickness of about 100 $\mu$m in order to set the operation voltage at a practical level. When the wafer is as thick as 100 $\mu$m, it is difficult to make a treatment on one surface of the wafer after the other surface thereof is processed. Therefore, in general, after its one surface is processed, the wafer is sliced thinner, and then its reverse surface is subjected to a treatment (ion implantation, annealing at about 500° C.).

In the process using the raw wafer, the reverse side of the wafer is also made of a low impurity concentration N-type Si. To reduce the contact resistance of a reverse surface electrode, it is necessary to make the impurity concentration of the reverse Si surface high. Accordingly, after ions are implanted into the reverse surface, the wafer is subjected to a heat treatment executed at 500° C. in a diffusion furnace, thereby activating the implanted ions and forming a high impurity concentration layer.

The above method, however, has the following problems. When employing ion implantation, an expensive ion implanting device is required, and a wafer may have a crystal defect.

Further, when employing chemical doping, a reactive gas containing an additive such as a catalyst is supplied from the outside into the vacuum chamber, and therefore a pure reaction does not occur.

In addition, to completely activate ions after they are implanted, it is necessary to execute annealing at about 1000° C. for one hour. However, an $N^+$-source, a $P^+$-well, and a source/drain electrode are already formed in the surface of a substrate before annealing. Therefore, if annealing is executed, the surface electrode may be damaged, or its function may be degraded. This limits the temperature of heat treatment to 500° C. or less.

For these reasons, the temperature of heat treatment executed on the reverse surface of the substrate cannot be increased to a sufficient activation enabling value. Accordingly, the P-type layer cannot sufficiently be formed and ion activation cannot sufficiently be executed. As a result, a high voltage is required for turning on the resultant transistor.

In addition, because of its structure, the diffusion furnace for executing ion activation cannot be used as the ion implanting device or as the vacuum chamber for reacting a reactive gas. Therefore, a wafer must be conveyed between the doping process and the activation process. If a thin wafer is used, it is very possible that the wafer will break while it is conveyed from the ion implanting device or the vacuum chamber to the diffusion furnace. This reduces the process yield.

BRIEF SUMMARY OF THE INVENTION

It is the object of the invention to provide a semiconductor element manufacturing method and apparatus, in which when forming an electrode on the reverse surface of an Si chip, doping an Si wafer with an impurity and activation of the impurity are simultaneously executed using a laser beam, thereby realizing an ideal impurity concentration profile.

In the invention, an impurity is implanted into an Si chip and activated therein by placing the Si wafer on a table in a sealed container, and applying a laser beam to the Si wafer on the table through vapor of the impurity filled in the container.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
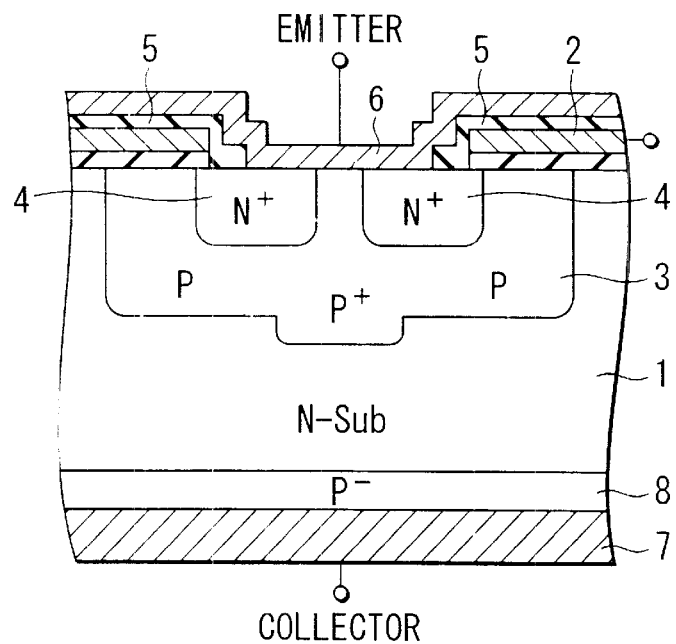
FIG. 1 is a sectional view illustrating an IGBT incorporated in a semiconductor element according to the invention.

The embodiments of the invention will be described with reference to the accompanying drawings. FIG. 1 is a sectional view illustrating an IGBT incorporated in a semiconductor element according to the invention. As is shown in FIG. 1, a wafer 1 formed of an N-type Si substrate has a $P^+$-type well region formed by implanting a high concentration P-type impurity, a gate electrode 2 on a gate insulating film, a P-type base region 3, an $N^+$-type emitter region 4, and an insulating film 5. An emitter electrode 6 is provided on the wafer 1 so as to short-circuit the P-type base region 3 and the $N^+$-type emitter region 4.

A collector electrode 7 is provided on the reverse surface of the wafer 1. Aluminum or an aluminum alloy, which is a conductive metal and doped with boron, is used as the material of the collector electrode 7. A low impurity concentration P-type layer ($P^-$-type layer) 8 is formed adjacent to the collector electrode 7, thereby forming a good low-resistant ohmic contact.

A method for manufacturing the IGBT having the above-described structure will now be described. At first, the $P^+$-type well region, the gate electrode 2 on the gate insulating film, the P-type base region 3, the $N^+$-type emitter region 4, and the insulating film 5 are formed in and on the Si wafer 1. Subsequently, aluminum as the material of the emitter electrode 6 is provided on the wafer 1 so as to short-circuit the P-type base region 3 and the $N^+$-type emitter region 4. By the time when these processes finish, various heat treatments for the electrodes, such as annealing, a re-flow treatment, etc., are executed appropriately.

Figures 2A, 2B, 2C:
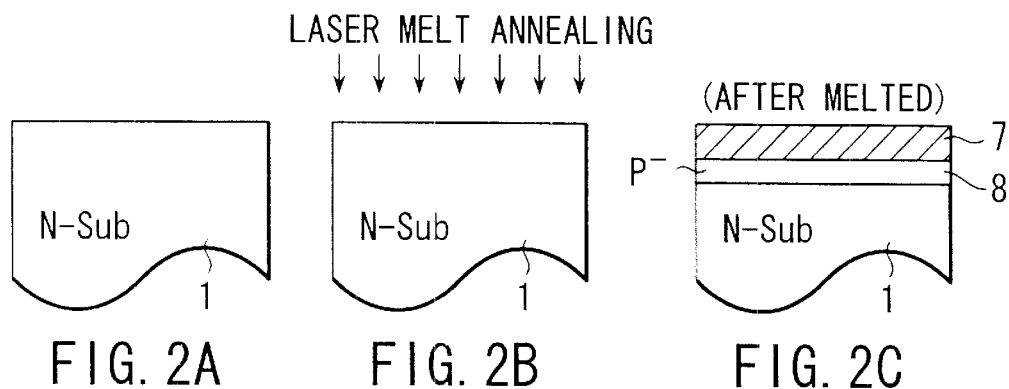
FIGS. 2A–2C are views useful in explaining a process executed on the reverse surface of a wafer.

After executing the treatments on one surface of the wafer 1, the reverse surface of the wafer 1 is processed. This process will be described with reference to FIGS. 2A–2C. The reverse surface of the wafer 1, as shown in FIG. 2A, is melted by laser melt annealing (FIG. 2B), thereby implanting, diffusing and activating boron therein to form a P-type layer (FIG. 2C). Thus, a low concentration P-type layer ($P^-$-type layer) 8 is formed in the wafer 1. After that, aluminum, vanadium, nickel and gold are applied to the reverse surface by sputtering, thereby forming the collector electrode 7.

Figure 3:
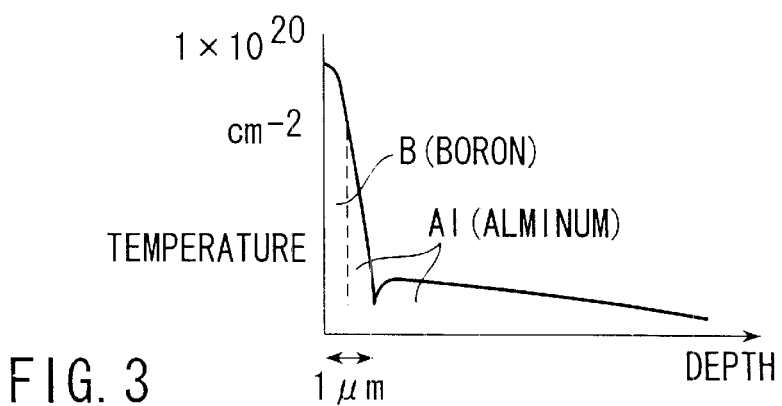
FIG. 3 is a graph illustrating the difference in diffusion efficiency between aluminum and boron.

FIG. 3 is a graph illustrating an impurity concentration profile in a collector region formed by this method and shown in FIG. 2C. In the laser melt annealing method, a laser beam is applied to the reverse surface of the wafer 1, and the heat of the laser beam is applied only to the reverse surface. As is evident from FIG. 3, the difference in diffusion efficiency between aluminum and boron is used in this method.

Specifically, the diffusion rate of aluminum is higher than that of boron. As a result, boron having a lower diffusion rate remains near the collector electrode 7, thereby forming a high impurity concentration P-type layer near the collector electrode 7. On the other hand, a wide aluminum-distributed region is formed adjacent to the narrow boron-distributed region, thereby forming a low impurity concentration P-type layer 8. Thus, a low impurity concentration region is realized while achieving ohmic contact, which means that a collector region in which carriers have a short lifetime (the concentration of a carrier easily reduces) is completed.

This structure is very useful in improving a switching loss (i.e. useful in reducing an electric resistance). Further, the electrode provided on the reverse surface of the wafer provides the same advantage as above even when it is used in a light-trigger type thyrister, a reverse-element type GTO thyrister, etc.

Figure 4:
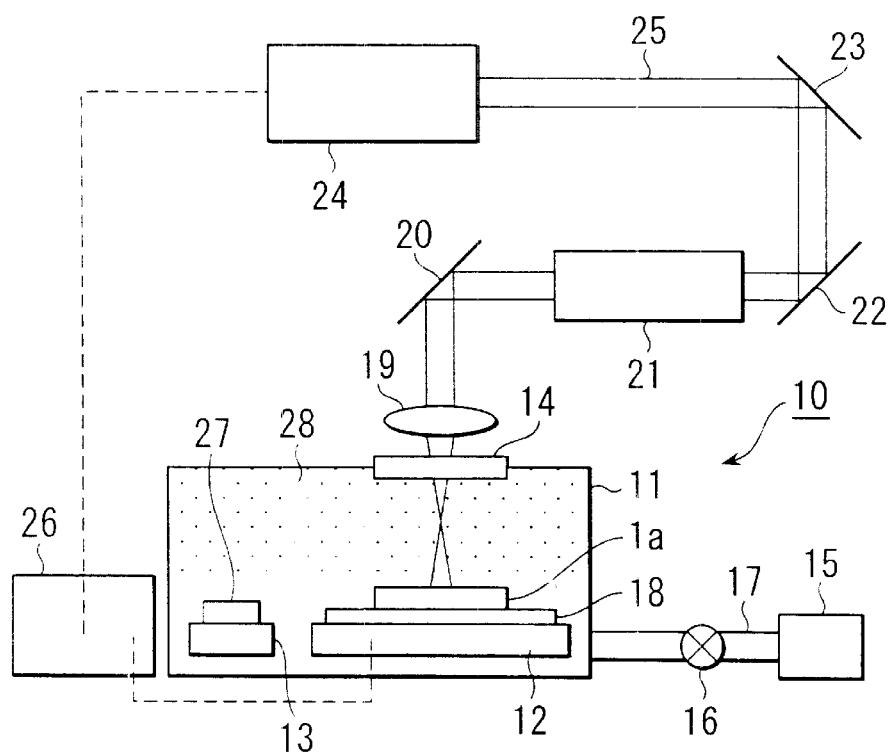
FIG. 4 is a schematic view illustrating a laser heating apparatus according to a first embodiment of the invention.

FIG. 4 is a schematic view illustrating a laser heating apparatus 10 for simultaneously executing impurity doping and activation to realize the above-described process. The laser heating apparatus 10 includes a high vacuum chamber 11 formed of a sealed container, in a lower portion of which an XY table 12 and a metal heater 13 are provided. A transmission window 14 made of, for example, quartz glass for transmitting a laser beam is formed in a ceiling portion of the high vacuum chamber 11, while a pipe 17 connected to a vacuum pump 15 through a valve 16 is connected to a side wall portion of the chamber 11.

A heater 18 is fixed on the upper surface of the XY table 12. The heater 18 has an upper surface serving as a mount surface for mounting thereon the wafer 1 as a to-be-processed object. On the optical path above the transmission window 14, there are provided, in the following order from the transmission window 14, an image forming lens 19, a mirror 20, a homogenizer 21 for homogenizing the spatial intensity distribution of the laser beam, a mirror 22, a mirror 23 and a laser oscillator 24. A controller 26 is connected to the laser oscillator 24, the XY table 12, the valve 16, etc. through respective signal lines (not shown). The laser oscillator 24 is formed of a short-pulse high output XeCl excimer laser or a KrF excimer laser. The pulse width of the oscillator is set at, for example, 20 ns (half-value width).

The laser heating apparatus 10 constructed as the above executes impurity doping and activation in the following manner. The wafer 1 is placed on the heater 18 of the XY table 12 in the high vacuum chamber 11, while solid boron, for example, is placed as a dopant source 27 on the metal heater 13. The metal heater 13 is operated to evaporate boron, thereby filling the interior of the high vacuum chamber 11 with boron vapor 28. In this state, the laser oscillator 24 is operated. A laser beam 25 output from the oscillator 24 is guided to the homogenizer 21 via the mirrors 23 and 22, and applied to the wafer 1 in the high vacuum chamber 11 via the mirror 20, the image forming lens 19 and the transmission window 14.

To apply the laser beam 25 to the entire surface of the wafer 1, the XY table 12 with the wafer 1 mounted thereon is moved in the X- and Y-directions by the controller 26. The controller 26 also executes control for synchronizing the movement of the XY table 12 with the laser radiation. The portion of the wafer 1 to which the laser beam 25 is applied is instantaneously annealed at a high temperature, whereby doping and activation of boron are simultaneously executed in the portion.

Since, in the above method, the pulse width of the laser beam 25 emitted from the laser oscillator 24 is as short as about 20 ns (half-value width), only a surface portion (with a thickness of 1 $\mu$m–3 $\mu$m) of the wafer 1 can be heated. Thus, the method enables only a surface layer, as a to-beradiated portion, of the wafer 1 to be annealed at a high temperature and to be doped with an impurity as a dopant.

In other words, the use of a short-pulse high output XeCl excimer laser or a KrF excimer laser as the laser oscillator 24 enables simultaneous execution of doping of an impurity (e.g. boron) and activation of the impurity.

Referring again to FIG. 4, a description will be given of a case where Sb (antimony) is implanted in an Si wafer and then activated therein, using the device of FIG. 4.

The wafer 1 is placed on the heater 18 on the XY table 12 in the high vacuum chamber 11, and solid metal Sb as the dopant source 27 is placed on the metal heater 13. The high vacuum chamber 11 is connected via, for example, the pipe 17 to the vacuum pump 15 that can exhaust the high vacuum chamber 11 to about $1 \times 10^{-5}$ Pa.

When the metal heater 13 has been heated to about 350° C. in light of the vapor pressure characteristics of Sb, Sb vapor 28 is generated in the high vacuum chamber 11. In this state, the laser oscillator 24 is oscillated, thereby outputting a laser beam 25. The laser beam 25 is guided to the homogenizer 21 via the mirrors 23 and 22, and applied to the wafer 1 in the high vacuum chamber 11 via the mirror 20 and the image forming lens 19. Radiation of the laser beam onto the entire surface of the wafer 1 is executed by moving the YX table 12 in the X- and Y-directions. Synchronization of the movement of the XY table 12 with the radiation of the laser beam 25 is executed by the controller 26.

The frequency of the laser oscillation of the laser oscillator 24 is 200 Hz or 300 Hz, and the laser beam applied to the wafer 1 is a square beam with sides of 1 mm–5 mm. This beam is applied to the wafer 1 that has a size of 5, 6 or 8 inches. The XY table 12 is moved in the X- and Y-directions with an overlapping amount of 100 µm–200 µm. The intensity of the laser beam 25 is set at 2.0 J/cm², while the heater 18 that mounts the wafer 1 thereon is set at 400° C. Under these conditions, predetermined doping and activation of Sb can be executed in the wafer 1. If the intensity of the laser beam is 0.5 J/cm² or less, the wafer 1 cannot sufficiently be heated, whereas if the intensity is 2.5 J/cm² or more, the wafer 1 becomes aberrant. In light of this, it is preferable that the intensity of the laser beam is set at 0.5–2.5 J/cm².

Figure 5:
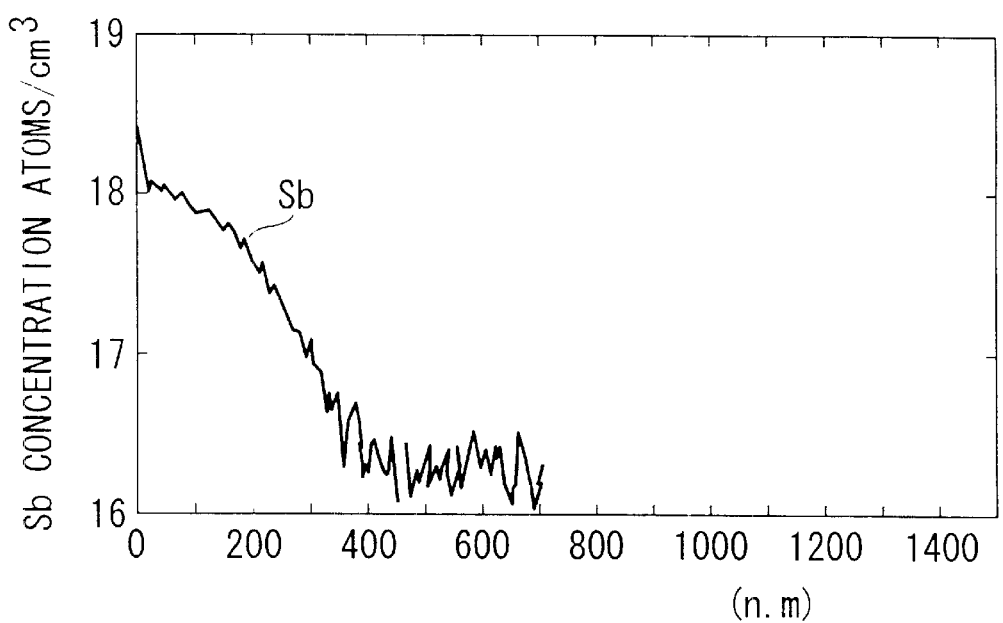
FIG. 5 is a graph showing a depth profile obtained by the SIMS, which indicates a distribution of Sb implanted in an Si wafer.

FIG. 5 is a graph showing a depth profile obtained by the SIMS, which indicates a distribution of Sb implanted in a wafer. It is understood from this figure that Sb is implanted up to a depth of 0.4 µm at maximum. In other words, only a surface layer of the wafer is doped with Sb.

The heating temperature (350° C.) of Sb is determined on the basis of the pressure and the temperature in the high vacuum chamber 11. If the pressure in the high vacuum chamber 11 is set at $1 \times 10^{-5}$ Pa, it is understood from the Sb vapor pressure characteristics that Sb vapor is generated when the temperature in the chamber 11 has been increased to 310° C. or more. When evaporating P, instead of Sb, under the same pressure as above, it is sufficient if the interior of the chamber 11 is heated to 70° C.

Figure 6:
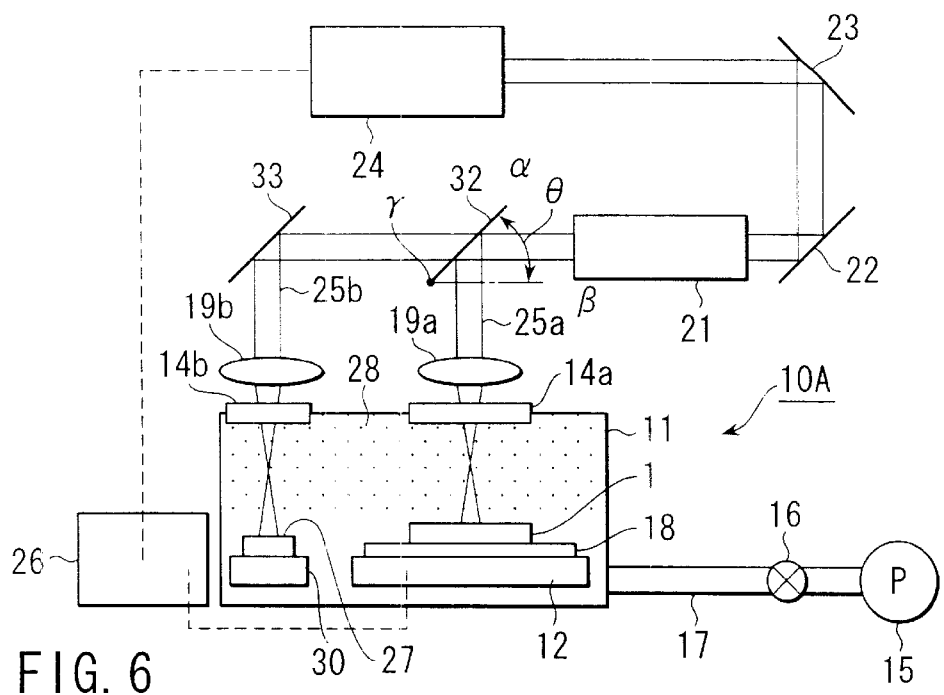
FIG. 6 is a schematic view illustrating a laser heating apparatus according to a second embodiment of the invention.

FIG. 6 is a schematic view illustrating a laser heating apparatus 10A according to a second embodiment of the invention. In FIG. 6, elements similar to those shown in FIG. 4 are denoted by corresponding reference numerals, and no detailed description will be given thereof. Two transmission windows 14a and 14b are formed in ceiling portions of the high vacuum chamber 11 for transmitting therethrough laser beams 25a and 25b described later. A pipe 17 connected to a carrier gas cylinder 31 and a vacuum pump 15 through a valve 16 is connected to a side wall portion of the chamber 11. The vacuum pump 15 can exhaust the chamber 11 to a vacuum degree of about $1 \times 10^{-5}$ Pa.

On the optical path above the transmission window 14a, there are provided, in the following order from the transmission window 14a, an image forming lens 19a, a movable half mirror 32, a homogenizer 21, a mirror 22, a mirror 23 and a laser oscillator 24. The movable half mirror 32 is disposed to be swung about a point γ by a driving source (not shown) from a position α to a position β through a predetermined angle θ.

On the optical path above the transmission window 14b, there are provided an image forming lens 19b and a mirror 33 in this order from the transmission window 14b. Accordingly, a laser beam 25 emitted from the laser oscillator 24 is parted in accordance with the position of the movable half mirror 32, and guided into the high vacuum chamber 11 through the transmission windows 14a and 14b.

The controller 26 is connected to the laser oscillator 24, the XY table 12, the valve 16, etc. through respective signal lines (not shown) for controlling them.

In the above-described structure, the wafer 1 is placed on the heater 18 of the XY table 12 in the high vacuum chamber 11, while solid boron (B), for example, is placed as a dopant source 27 on a dopant mount table 30.

Subsequently, the laser oscillator 24 is oscillated where the movable half mirror 32 is set in the position β, whereby the output laser beam 25b is guided to the high vacuum chamber 11 through the transmission window 14b and applied to boron placed on the dopant mount table 30. The radiation heat of the laser beam 25b evaporates the boron. As a result, the wafer 1 on the XY table 12 as the process section in the high vacuum chamber 11 is exposed to boron vapor 28 filling the chamber 11.

After that, the movable half mirror 32 is shifted to the position α. In this state, a laser beam 25 output from the laser oscillator 24 is guided to the beam homogenizer 21 via the mirrors 23 and 22, and applied to the wafer 1 in the high vacuum chamber 11 through the movable half mirror 32, the image forming lens 19a and the transmission window 14a.

To apply the laser beam 25a to the entire surface of the wafer 1, the XY table 12 with the wafer 1 mounted thereon is moved in the X- and Y-directions by the controller 26. The controller 26 also executes control for synchronizing the movement of the XY table 12 with the laser radiation. The portion of the wafer 1 to which the laser beam 25 is applied is instantaneously annealed at a high temperature, whereby doping and activation of boron are simultaneously executed in the portion.

A description will be given of a case where an IGBT is formed on an Si wafer using the laser heating apparatus 10A constructed as the above. At first, all predetermined treatments for forming electrodes are executed on one surface of the wafer 1 as a raw wafer. Subsequently, the reverse surface of the wafer 1 is ground considering the breakdown voltage level of the semiconductor element, thereby slicing the wafer 1 to a predetermined thickness. Then, a doping treatment is executed on the reverse surface of the wafer 1. In this process, the wafer 1 is placed on the heater 18 on the YX table 12 as the process section, with its reverse surface directed upward. The movable half mirror 32 is shifted to the position β, and the laser oscillator 24 is oscillated to apply the laser beam 25 as an excimer laser beam to a dopant source 27b such as P or As.

The amount of a dopant implanted in the wafer 1 is controlled by the output of the laser oscillator 24 as an excimer laser. After that, the movable half mirror 32 is returned to the position α, the excimer laser beam is applied to the reverse surface of the wafer 1, which is exposed to the atmosphere of a radical dopant, thereby melting a surface layer of the reverse surface and dope the reverse surface with an N-type dopant (e.g. P, As, etc.).

Subsequently, boron is implanted. In this process, the laser radiation condition for implanting boron in the process section is controlled so that a to-be-melted surface portion of the wafer 1 for boron is shallower than the melted surface portion of the wafer 1, which is doped with P or As.

Thereafter, Al is applied to the resultant wafer by sputtering and a heat treatment at 450° C. is executed thereon, thereby forming an ohmic electrode. Lastly, V (vanadium), Ni (nickel) and Au (gold) are applied to the reverse surface by a sputtering apparatus, thereby terminating the process.

Referring to FIG. 6, a description will be given of the formation of a PMOSFET on an Si wafer. At first, all predetermined treatments for forming electrodes are executed on one surface of the wafer 1 as a raw wafer. Subsequently, the reverse surface of the wafer 1 is ground considering the breakdown voltage level of the semiconductor element, thereby slicing the wafer 1 to a predetermined thickness. Then, a doping treatment is executed on the reverse surface of the wafer 1, using the laser heating apparatus 10A. In this process, the wafer 1 is placed on the heater 18 on the YX table 12 as the process section, with its reverse surface directed upward. After that, the vacuum pump 15 is operated. The movable half mirror 32 is shifted to the position β, and the laser oscillator 24 is oscillated to apply the laser beam 25 as an excimer laser beam to a dopant source 27c mounted on the dopant mount table 30.

The amount of a dopant implanted in the wafer 1 is controlled by the output of the laser oscillator 24 as an excimer laser, and the flow rate of Ar gas. After a carrier gas containing a radical is uniformly applied to the wafer 1, the excimer laser beam is applied to the reverse surface of the wafer 1 to melt a surface layer of the reverse surface and dope the reverse surface with an N-type dopant (e.g. P, As, etc.).

Lastly, V (vanadium), Ni (nickel) and Au (gold) are applied to the reverse surface by a sputtering apparatus, thereby terminating the process.

Figure 7:
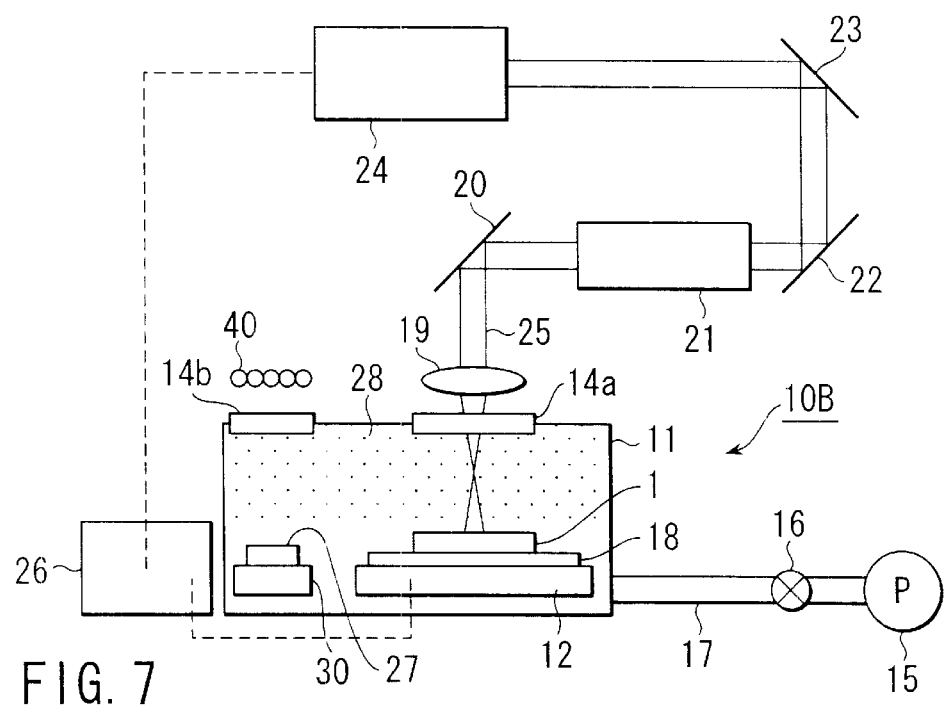
FIG. 7 is a schematic view illustrating a laser heating apparatus according to a third embodiment of the invention.

In the laser heating apparatus 10A, the application of the laser beams 25a and 25b to boron and the wafer 1 is realized by distributing the laser beam 25 emitted from the single laser oscillator 24, using the movable half mirror 32. However, two laser heating apparatuses dedicated to heating boron and to melting the wafer 1 may be used. Further, a movable total reflection mirror may be used in place of the movable half mirror 32. Moreover, as in a laser heating apparatus 10B shown in FIG. 7, there may be provided an optical system having a heating light source 40 for heating boron, and an optical system having a laser oscillator 24 for applying a laser beam to the wafer 1. In this case, the movable half mirror 32 shown in FIG. 6 is not necessary.

Figure 8:
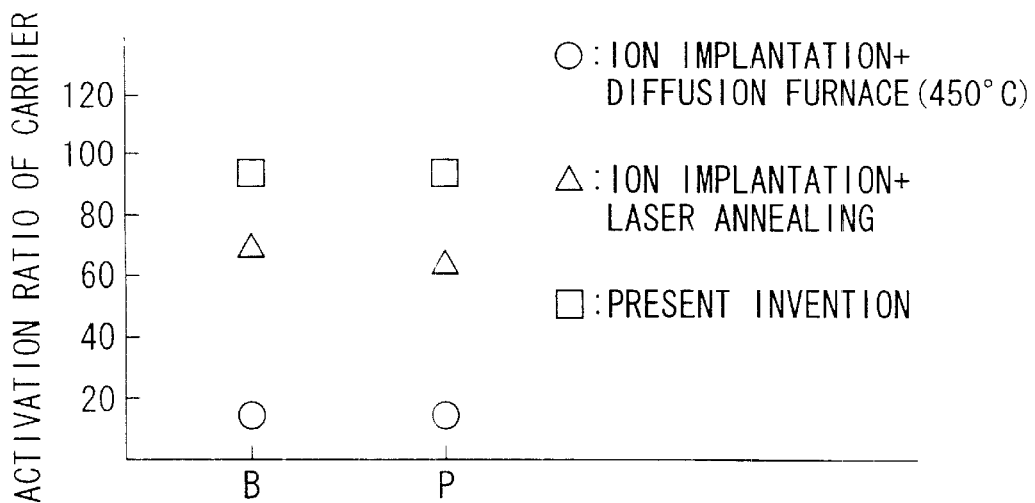
FIG. 8 is a graph illustrating the activation ratios of doped carries obtained by different methods when using boron (B) and phosphor (P) as dopants.

FIG. 8 is a graph showing differences in the activation ratio of a doped carrier to B or P (the number of the ions of a free carrier/the number of the ions of the impurity B or P) between the method employed in each of the above-described embodiments and conventional methods. The conventional methods specifically mean a method using ion implantation and a diffusion furnace (450° C.) and a method using ion implantation and laser annealing.

As is evident from the graph of FIG. 8, in the embodiments, the activation ratio of the carrier to B or P exceeds 80%. On the other hand, in the case of the method using ion implantation and laser annealing, the activation ratio is 60–80%, and in the case of the method using ion implantation and a diffusion furnace (450° C.), it is less than 20%. Thus, the embodiments show an excellent activation ratio.

Figure 9:
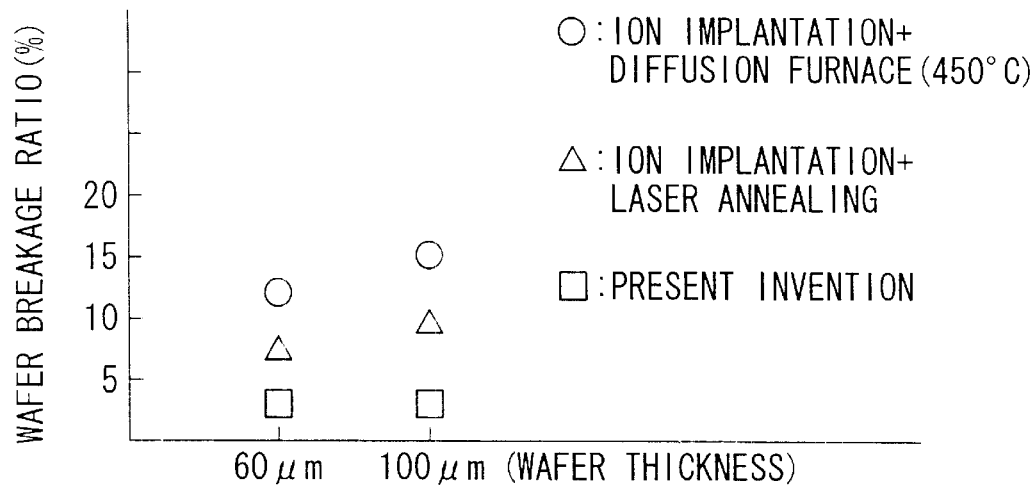
FIG. 9 is a graph illustrating the occurrence ratios of wafer breakage obtained during a process by different methods.

FIG. 9 is a graph showing differences in wafer breakage occurrence ratio during a process between the method employed in each of the above-described embodiments and conventional methods. In the conventional methods, it is necessary to transfer a wafer from a process device to another process device, and therefore it is difficult to completely prevent the occurrence of wafer breakage. On the other hand, in the present invention, all treatments are executed in the same device, and hence wafer breakage hardly occurs.

Although in each of the above-described embodiments, the metal heater 13 and the laser beam 25b are used as dopant heating means, a resistance heating method or a lamp heating method may be employed.

Furthermore, when using Si as a semiconductor material, the Si semiconductor can be made as a P-type semiconductor by using a trivalent impurity, typically boron. On the other hand, if an impurity having five valences, typically P (phosphor), As (arsenic) or Sb (antimony), is used, an N-type semiconductor can be obtained.

As described above, the present invention can provide a method and apparatus capable of substantially simultaneously implanting an impurity into a wafer and activating it, which makes it unnecessary to use an ion implanting device and chemical implanting means using inclusion of a reactive gas as in the conventional case. As a result, an ideal impurity concentration profile can be realized on the reverse surface electrode of an IGBT or a PMOSFET.

The present invention is not limited to the above-described embodiments, but is widely applicable to various cases where an impurity is implanted. For example, it can be applied when forming a source region or a drain region in a MOS transistor, or in an impurity diffusion process executed in forming an LDD or a DRAM. It is a matter of course that the invention may be modified in various ways without departing from its scope.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming an electrode on a semiconductor region of a semiconductor substrate, comprising the steps of:

placing a source of an impurity in a solid state in a container in which the semiconductor substrate is placed;

depressurizing the container;

heating and evaporating the source in the depressurized container; and applying a laser beam in a direction perpendicular to the semiconductor substrate under an atmosphere of the vaporized impurity, thereby implanting the impurities into the semiconductor substrate.

2. The method according to claim 1, wherein the semiconductor substrate is a silicon wafer.

3. The method according to claim 1, wherein the semiconductor substrate is a silicon wafer, the beam is an XeCl excimer laser beam or a KrF excimer laser beam, and the laser beam is set to have an intensity within a range of 0.5 J/cm$^2$ to 2.5 J/cm$^2$ on the silicon wafer.

4. An apparatus for forming an electrode on a semiconductor substrate to produce a semiconductor element, comprising:

a container having a light transmission window;

a table disposed in the container to mount the semiconductor substrate thereon;

heating means arranged in the container to heat and evaporate a source of an impurity in a solid state; and laser beam applying means for applying a laser beam from the outside of the container through the light transmission window, in a direction perpendicular to the semiconductor substrate to be placed on the table in order to implant the impurities into the semiconductor, wherein the laser beam applying means is an XeCl excimer laser or a KrF excimer laser, and the laser beam is set to have, on the semiconductor substrate, an intensity within a range of 0.5 J/cm$^2$ to 2.5 J/cm$^2$.

5. A doping method comprising:

an evaporation step of heating and evaporating at least one impurity placed in a solid state in a sealed container; and a doping step of applying a laser beam in a direction perpendicular to a substrate placed in the sealed container after passing the laser beam through vapor of the at least one impurity created in the evaporation step, thereby doping the substrate with the at least one impurity.

6. The method according to claim 5, wherein heating of the impurity in the evaporation step is executed by applying, to the at least one impurity, a laser beam generated from a light source from which the laser beam applied to the substrate is generated.

7. The method according to claim 5, wherein the at least one impurity is selected from group III or V elements.

8. The method according to claim 5, wherein the substrate is a silicon wafer.

9. The method according to claim 5, wherein the substrate is a silicon wafer, and in the doping step, the laser beam is set to have, on the silicon wafer, an intensity within a range of 0.5 J/cm$^2$ to 2.5 J/cm$^2$.

10. A method of manufacturing a semiconductor device having electrodes formed on respective surfaces of a substrate, comprising:

first step of forming an electrode on one surface of the substrate;

a second step of polishing another surface of the substrate to a predetermined thickness after the first step;

a step of placing the substrate and at least one solid impurity in a sealed container after the second step;

a step of heating and evaporating the at least one solid impurity; and a doping step of applying a laser beam in a direction perpendicular to said another surface of the substrate to dope said another surface with the at least one impurity.

11. The method according to claim 10, wherein the at least one impurity is selected from group III or V elements.

12. The method according to claim 10, wherein the substrate is a silicon wafer.

13. The method according to claim 10, wherein the substrate is a silicon wafer, and in the doping step, the laser beam is set to have, on the silicon wafer, an intensity within a range of 0.5 J/cm$^2$ to 2.5 J/cm$^2$.

* * * * *